US007373569B2

(12) United States Patent
Klass

(10) Patent No.: US 7,373,569 B2
(45) Date of Patent: May 13, 2008

(54) PULSED FLOP WITH SCAN CIRCUITRY

(75) Inventor: Edgardo F. Klass, Palo Alto, CA (US)

(73) Assignee: P.A. Semi, Inc., Santa Clara, CA (US)

( * ) Notice: Subject to any disclaimer, the term of this patent is extended or adjusted under 35 U.S.C. 154(b) by 220 days.

(21) Appl. No.: 11/304,854

(22) Filed: Dec. 15, 2005

(65) Prior Publication Data

US 2007/0143647 A1 Jun. 21, 2007

(51) Int. Cl.
*G01R 31/28* (2006.01)

(52) U.S. Cl. ............... 714/726; 714/718; 714/30; 714/733; 714/729; 716/2; 327/144; 326/38; 326/48; 326/59; 326/46

(58) Field of Classification Search ............... None
See application file for complete search history.

(56) References Cited

U.S. PATENT DOCUMENTS

| | | | |
|---|---|---|---|
| 4,554,664 A * | 11/1985 | Schultz ............... | 714/726 |
| 4,564,772 A | 1/1986 | Maley et al. | |
| 4,628,216 A | 12/1986 | Mazumder | |
| 5,426,380 A | 6/1995 | Rogers | |
| 5,619,511 A * | 4/1997 | Sugisawa et al. ........ | 714/726 |
| 5,719,878 A * | 2/1998 | Yu et al. ............ | 714/726 |
| 5,784,384 A * | 7/1998 | Maeno ............... | 714/726 |
| 5,996,039 A * | 11/1999 | Lee ................. | 710/316 |
| 6,002,284 A * | 12/1999 | Hill et al. ............ | 327/202 |
| 6,087,886 A * | 7/2000 | Ko .................. | 327/408 |
| 6,346,828 B1 * | 2/2002 | Rosen et al. ........... | 326/56 |
| 6,348,825 B1 * | 2/2002 | Galbi et al. ............ | 327/218 |
| 6,629,276 B1 | 9/2003 | Hoffman et al. | |
| 6,686,775 B2 | 2/2004 | Campbell | |
| 6,724,221 B2 | 4/2004 | Carballo et al. | |
| 6,828,838 B1 | 12/2004 | Anshumali et al. | |

(Continued)

OTHER PUBLICATIONS

U.S. Appl. No. 11/304,165, filed Dec. 15, 2005, 23 pages.

(Continued)

*Primary Examiner*—John P Trimmings
(74) *Attorney, Agent, or Firm*—Lawrence J. Merkel; Meyertons, Hood, Kivlin, Kowert & Goetzel, P.C.

(57) ABSTRACT

In one embodiment, a storage circuit comprises a first passgate having an input coupled to receive a signal representing a data input to the storage circuit and further having an output connected to a storage node in the storage circuit. The storage circuit also comprises a scan latch having an input connected to a scan data input to the storage circuit and further coupled to receive a scan enable input. The scan latch is configured to store the scan data input responsive to an assertion of the scan enable input, and also comprises a second passgate connected to the storage node and having an input coupled to receive the stored scan data. Each of the first passgate and the second passgate are coupled to receive respective pairs of control signals to control opening and closing of the passgates, wherein the scan enable signal controls which of the respective pairs of control signals are pulsed. In this manner, only one of the first passgate and the second passgate is opened in a given clock cycle of a clock signal from which the pulses are generated.

18 Claims, 3 Drawing Sheets

U.S. PATENT DOCUMENTS

| | | | |
|---|---|---|---|
| 6,911,845 B2* | 6/2005 | Hossain et al. | 326/93 |
| 6,914,453 B2 | 7/2005 | Dhong et al. | |
| 7,082,560 B2* | 7/2006 | Parulkar et al. | 714/726 |
| 7,245,150 B2 | 7/2007 | Goel et al. | |
| 2005/0268191 A1* | 12/2005 | Shin | 714/726 |
| 2006/0103443 A1* | 5/2006 | Rhee et al. | 327/218 |

OTHER PUBLICATIONS

U.S. Appl. No. 11/304,855, filed Dec. 15, 2005, 26 pages.

Samuel D. Naffziger, et al., "The Implementation of the Itanium 2 Microprocessor," IEEE Journal of Solid-State Circuits, vol. 37, No. 11, Nov. 2002, 13 pages.

* cited by examiner

PULSED FLOP WITH SCAN CIRCUITRY

BACKGROUND

1. Field of the Invention

This invention is related to the field of clocked storage devices such as flops, latches, registers, etc.

2. Description of the Related Art

The operating frequency of processors and other digital integrated circuits has continued to increase, reaching the GigaHertz (GHz) range in recent years. As the frequency has increased, the delay attributable to the clocked storage devices used to store state at the clock cycle boundaries has grown to a larger percentage of the clock cycle time. Accordingly, the amount of time available to do "useful work" has decreased.

Similarly, clocked storage devices typically support scan functionality for test purposes. The clocked storage devices may be linked together through special scan-in inputs and scan-out outputs in one or more "scan chains". State can be scanned in and out of the clocked storage devices for debugging and/or other test purposes. Often, the scan functionality also impacts the delay attributable to the clocked storage device.

SUMMARY

In one embodiment, a storage circuit comprises a first passgate having an input coupled to receive a signal representing a data input to the storage circuit and further having an output connected to a storage node in the storage circuit. The storage circuit also comprises a scan latch having an input connected to a scan data input to the storage circuit and further coupled to receive a scan enable input. The scan latch is configured to store the scan data input responsive to an assertion of the scan enable input, and also comprises a second passgate connected to the storage node and having an input coupled to receive the stored scan data. Each of the first passgate and the second passgate are coupled to receive respective pairs of control signals to control opening and closing of the passgates, wherein the scan enable signal controls which of the respective pairs of control signals are pulsed. In this manner, only one of the first passgate and the second passgate is opened in a given clock cycle of a clock signal from which the pulses are generated.

In another embodiment, a pulse generator for a scannable storage circuit is contemplated. The pulse generator is configured to generate a pair of control pulses that cause the storage circuit to store a data input to the storage circuit. The pulse generator comprises a plurality of series-connected inverters, wherein a first inverter of the plurality of inverters comprises a first transistor coupled between an output node of the first inverter and a second transistor of the first inverter. A gate of the first transistor is coupled to receive a signal derived from a scan enable signal, and a gate of the second transistor is coupled to an output of a second inverter of the plurality of series-connected inverters. The first transistor, during use, isolates the output node of the first inverter from the second transistor responsive to an assertion of the scan enable signal.

BRIEF DESCRIPTION OF THE DRAWINGS

The following detailed description makes reference to the accompanying drawings, which are now briefly described.

Figure 1:
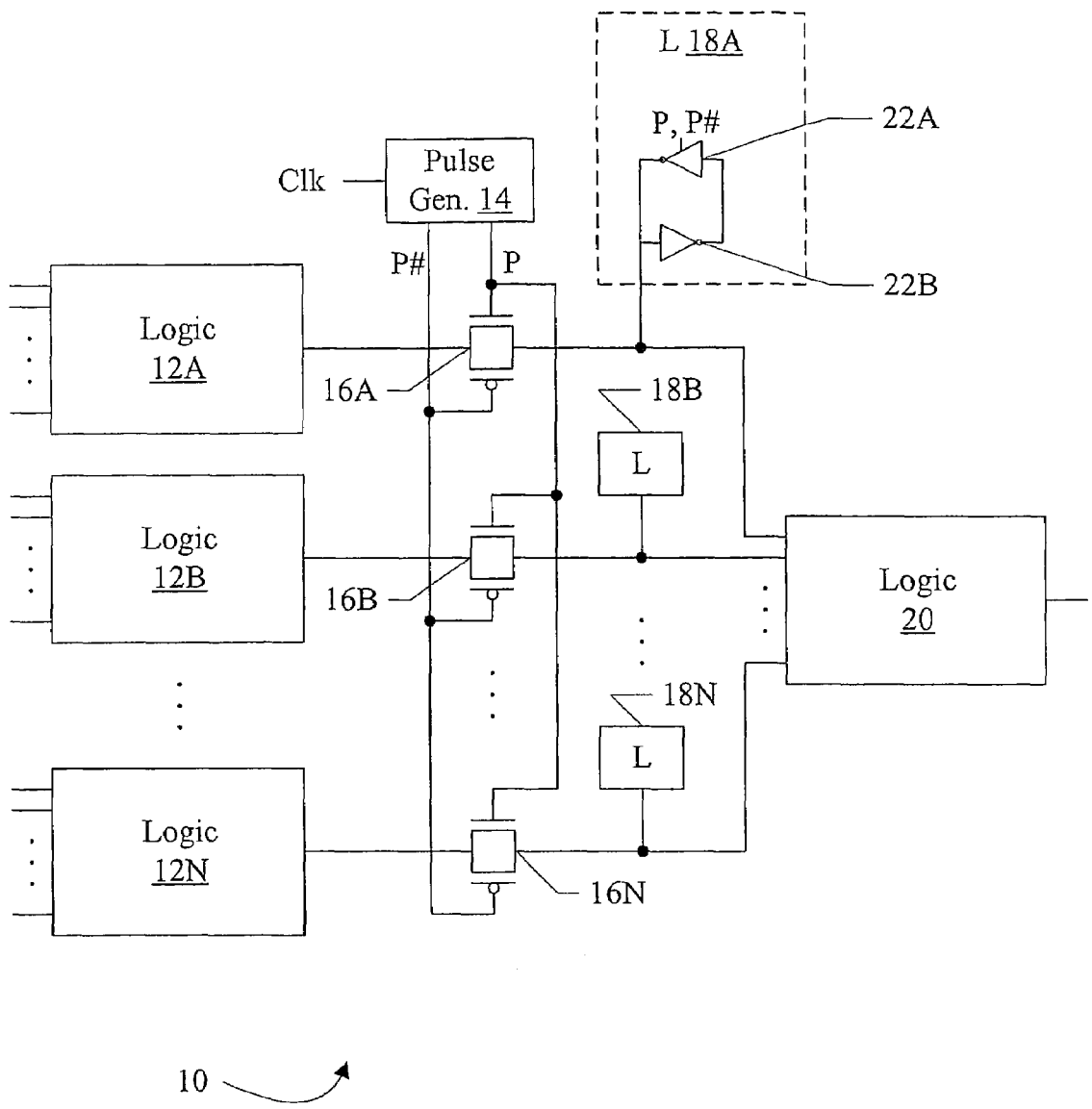
FIG. 1 is a circuit diagram of one embodiment of a pulsed flop with embedded logic.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

In the description below, the term "flop" is used to refer to the storage devices used in the example embodiments. A flop is typically an edge-triggered clocked storage device. That is, the flop captures a value responsive to a clock edge (e.g. the rising or falling edge), and stores the value in steady state until the next edge causes a new value to be captured. Other types of clocked storage devices may be used in other embodiments (e.g. latches, registers, etc.).

Turning now to FIG. 1, a circuit diagram of one embodiment of a pulsed flop with embedded logic 10 is shown. In the illustrated embodiment, the pulsed flop 10 includes input logic circuits 12A-12N, a pulse generator 14, passgates 16A-16N, latch elements 18A-18N, and an output logic circuit 20. Each input logic circuit 12A-12N has multiple inputs, and generates at least one output as a predefined logic operation on the inputs. Each output of the logic circuits 12A-12N is directly connected as an input to a respective passgate 16A-16N. The outputs of the passgates 16A-16N are each directly connected to an input of the output logic circuit 20, which generates at least one output as a predefined logic operation on the inputs. The passgates are coupled to receive a pair of control signals (P and P#) from the pulse generator 14, which is coupled to receive a clock signal (Clk). Also connected to each respective passgate 16A-16N output is a latch element 18A-18N. The latch elements 18A-18N are connected out of line with the passing of signals from the passgates 16A-16N to the output logic circuit 20. That is, the circuitry in the latch elements 18A-18N (e.g. cross-coupled inverters 22A-22B, shown in the latch element 18A) are not in the path between the passgates 16A-16N and the output logic circuit 20.

Generally, the logic circuits 12A-12N and 20 may implement any desired logic functions. The logic circuits 12A-12N and 20 need not be all the same logic function. Rather, the logic circuits 12A-12N may differ from each other and/or may differ from the logic circuit 20. Any complexity of logic may be implemented by each logic circuit 12A-12N and 20. For example, a single level of logic may be implemented (e.g. logical NAND, NOR, OR, AND, XOR, XNOR, etc.). A dual-level of logic may be implemented (e.g. AND-OR, OR-AND, etc.). In either of the above two examples, more than one level of logic circuitry may be implemented per logic level. Arbitrarily complex and/or specific logic may be implemented in various embodiments. In some embodiments, the logic circuits 12A-12N and 20 may not include clocked storage devices.

By integrating logic functions into the flop 10, the delay attributed to the flopping of data may be reduced to approximately the delay of passing through the passgates 16A-16N. The latch elements are not inline in the data propagation path, and may present a primarily capacitive load to the path, but not active delay. In some embodiments, the inverter that drives the node connected to the data propagation path (from the passgates to the output logic 20) may drive the node during the propagation of data and may present some additional delay. However, the drive strength may be weak compared to other driving circuitry, such as the inputs to the passgates 16A-16N. In some embodiments, the inverter driving that node (e.g. the inverter 22A in the latch element 18A) may be controlled by the control signals to the passgates and may inhibit driving the node during propagation of data, as explained in more detail below. A typical flop incurs at least two inverter delays in the data propagation path, and the inverters are doing no useful work in terms of the logic operation being implemented. By embedding logic in the flop 10, the inverters may be replaced by logic functions that are doing useful work, thus reducing the flop overhead.

The passgates 16A-16N control the propagation of the outputs from the logic circuits 12A-12N to the inputs of the logic circuit 20 based on the clock cycles defined by the clock signal Clk. For example, the flop 10 may be positive-edge triggered and thus propagation may occur responsive to the rising edge of the clock signal. Alternatively, the flop 10 may be negative edge triggered and thus propagation may occur responsive to the falling edge of the clock signal. In general, a passgate may comprise any circuitry that is configured to pass its input signal to its output responsive to one state of one or more control signals, and to inhibit passing the input signal to its output responsive to another state of the one or more control signals. When the passgate is passing the input signal to the output, it may be referred to as "open". When it is inhibiting passing of the input signal to the output, it may be referred to as "closed". Viewed in another way, a closed passgate may isolate its output from its input. In the illustrated embodiment, the passgates 16A-16N each comprise a parallel combination of an N-channel metal-oxide-semiconductor (NMOS) transistor and a P-channel MOS (PMOS) transistor. NMOS transistors are conductive when their gate-to-drain voltage is positive, while PMOS transistors are conductive when their gate-to-drain voltage is negative. Accordingly, a passgate such as those shown in FIG. 1 may be open if the P control signal (coupled to the gate of the NMOS transistor) is high (e.g. the power supply voltage, or $V_{DD}$) and the P# control signal (coupled to the gate of the PMOS transistor) is low (e.g. ground, or $V_{SS}$). In general, a signal may be referred to as "asserted" herein to indicate that the signal is activated. A signal may be asserted in a logical high state (e.g. $V_{DD}$) or a logical low state (e.g. $V_{SS}$). Signals that are asserted low are depicted in the drawings with a "#" following them (e.g. P# is asserted low). A signal is referred to as "deasserted" if it is in the opposite of its asserted state.

Figure 2:
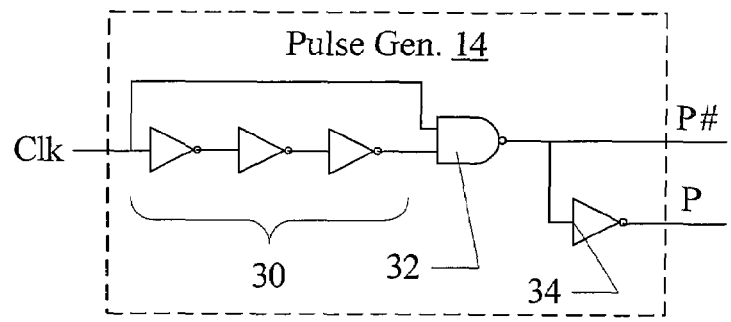
FIG. 2 is a circuit diagram of one embodiment of a pulse generator shown in FIG. 1.

In order to provide clocked storage device behavior, the pulse generator 14 may generate pulses on the control signals P and P# to open the passgates 16A-16N for a window of time responsive to the clock signal Clk. The passgates 16A-16N close at the end of the pulses. The latch elements 18A-18N capture the signals passed through the passgates, and store the signal state for the remainder of the clock cycle. Viewed in another way, the latch elements 18A-18N may retain the signal on each input to the logic circuit 20 after the passgates 16A-16N have closed, until the passgates open again. The clock signal Clk is a periodic waveform, the period of which defines the clock cycle for digital circuitry that may employ the flop 10. For a positive edge triggered flop, the pulses may be generated responsive to the rising edge of the clock signal Clk. For a negative edge triggered flop, the pulses may be generated responsive to the falling edge of the clock signal. In other embodiments, a combination of positive edge triggered and negative edge triggered may be used on signal by signal basis, and two pulse generators may be used. Additional details of one embodiment of a pulse generator are shown in FIG. 2 and provided below. As indicated by the signal names, the pulses on P and P# are opposite in polarity. The pulse P is high, returning to low at the end of the pulse. Conversely, the pulse P# is low, returning to high at the end of the pulse.

As used herein, a pulse comprises an assertion of a signal followed by a corresponding deassertion. Generally, the pulses may be narrow relative to the clock cycle as a whole. For example, the pulses may be less than 50% of the length of the clock cycle, and in some embodiments may be much less (e.g. 10% or even less of the clock cycle). The width of the pulse may be varied in various embodiments (e.g. any percentage of the length of the clock cycle that is less than 50%). Generally, a wider pulse may ease timing concerns with regard to the logic circuits 12A-12N and their inputs by providing a wider window to pass through the desired signal state. However, a wider window also imposes a higher hold time requirement for the stability of the desired signal state.

The latch elements 18A-18N may each comprise any type of memory circuit that is capable of capturing a signal provided on an input node and retaining the signal on the node after other sources driving the node have idled (e.g. after the passgates 16A-16N have closed). The latch elements 18A-18N may be clocked or unclocked, in various embodiments. One embodiment of the latch element 18A is shown in more detail in FIG. 1 to include a pair of cross-coupled inverters 22A-22B, and the other latch elements 18B-18N may be similar. Cross-coupled inverters are inverters that each have their output connected to the other inverter's input. Accordingly, in the absence of external stimulus, the cross-coupled inverters maintain a stable state. The input to the latch element 18A (e.g. the input to the inverter 22B and the output of the inverter 22A) may be referred to as a storage node, since the value on the storage node is the value that is sampled and stored by the latch element 18A (e.g. the signal on the input to the logic circuit 20 and the output of the passgate 16A). The other node (at the output of the inverter 22B and the input of the inverter 22A) stores the logical complement of the stored value. In the illustrated embodiment, the other node is not connected to anything other than the cross-coupled inverters 22A-22B.

In the illustrated embodiment, the inverter 22A is coupled to receive the control signals 22A-22B from the pulse generator 14, and may inhibit driving the storage node when the pulses are driven on the control signals. In this embodiment, the inverter 22A does not resist the signal driven by the input logic circuit 12A through the open passgate 16A. The inverter 22B reacts to the signal, capturing the new signal state for storage. When the pulses deassert, the inverter 22A drives the storage node with the newly captured signal, retaining the signal on the input to the logic circuit 20 until the passgate 16A opens again. Such a design may improve robustness when the flop 10 is operated at low supply voltage ($V_{DD}$) magnitudes. Additionally, in some embodiments, the lack of resistance by the inverter 22A to the new state may make the transition on the node more rapid. In other embodiments, the inverter 22A may be designed to have a relatively low drive strength (e.g. as compared to the drive strength of the input logic circuits 12A-12N have on their outputs). Thus, when the passgate 16A is open and the signal driven by the input logic circuit 12A is different than the stored signal in the latch element 18A, the output signal of the input logic circuit 12A overdrives the inverter 22A and changes the state of the latch element 18A.

It is noted that, in some embodiments, the pulse generator 14 may also receive an enable input signal. The enable input signal, if asserted, permits generation of pulses on the control signals P and P# and, if deasserted, prevents generation of pulses on the control signals. The enable signal may be used, e.g., for conditional clocking of the flop 10 (e.g. for power conservation reasons). In other embodiments, the clock signal Clk may be conditionally gated external to the flop 10.

Various embodiments may include any number of two or more inputs to the output logic circuit 20, and thus a corresponding number of passgates 16A-16N and latch elements 18A-18N. In some embodiments, one or more inputs to the logic circuit 20 may be inputs to the flop 10 as a whole (e.g. one more inputs to the passgates 16A-16N may be generated external to the flop 10, rather than by embedded logic circuits 12A-12N).

The flop 10 as a whole may be implemented as a standard cell that may be instantiated by designers of an integrated circuit. Multiple versions of the standard cell may be provided, varying the number of inputs, the input logic, and/or the output logic to provide a suite of flops 10 with low overhead. Accordingly, the input logic circuits 12A-12N, the passgates 16A-16N, the latch elements 18A-18N, the pulse generator 14, and the output logic circuit 20 may all be placed physically near each other as part of the same standard cell.

It is noted that, while the latch element 18A is shown as a pair of cross-coupled inverters, other embodiments may implement other memory structures. For example, other pairs of cross-coupled inverting gates may be used (e.g. NOR, NAND).

Turning now to FIG. 2, a circuit diagram of one embodiment of the pulse generator 14 is shown. A positive edge embodiment is illustrated. That is, the P and P# pulses are generated responsive to the rising edge of the clock signal Clk. A negative edge embodiment may be provided by inverting the clock signal Clk input. Other embodiments may use any pulse generation circuitry, including any Boolean equivalents of the illustrated circuitry.

In the illustrated embodiment, the pulse generator 14 includes a set of series-connected inverters 30, a NAND gate 32, and an inverter 34. The series-connected inverters 30 have an input coupled to receive the clock signal Clk, and an output connected as an input of the NAND gate 32. The other input of the NAND gate 32 is coupled to receive the clock signal Clk. In other embodiments, the NAND gate 32 may have additional inputs (e.g. an input for an enable signal). The output of the NAND gate 32 is the P# control signal, and is also connected to the input of the inverter 34. The output of the inverter 34 is the P control signal.

The series-connected inverters 30 delay the clock signal, producing a delayed clock signal at the output of the connection. The number of inverters is odd in this embodiment, and thus the delayed clock signal is also inverted with respect to the clock signal Clk. Accordingly, when a rising transition of the clock signal Clk occurs, the NAND gate 32 has two binary one inputs for the period of time that the rising transition propagates through the series-connected inverters 30. Thus, during this period of time, the output of the NAND gate 32 is a binary zero. The output of the NAND gate 32 returns to binary one when the rising transition completes propagation through the series-connected inverters 30, providing a binary zero input to the NAND gate 32. The output of the NAND gate 32 remains at a binary one until the next rising transition of the clock signal Clk. Viewed in another way, the width of the pulses on the P# control signal (and the P control signal, generated by inverting the P# control signal in the inverter 34) is determined by the number of inverters in the series connection.

Figure 3:
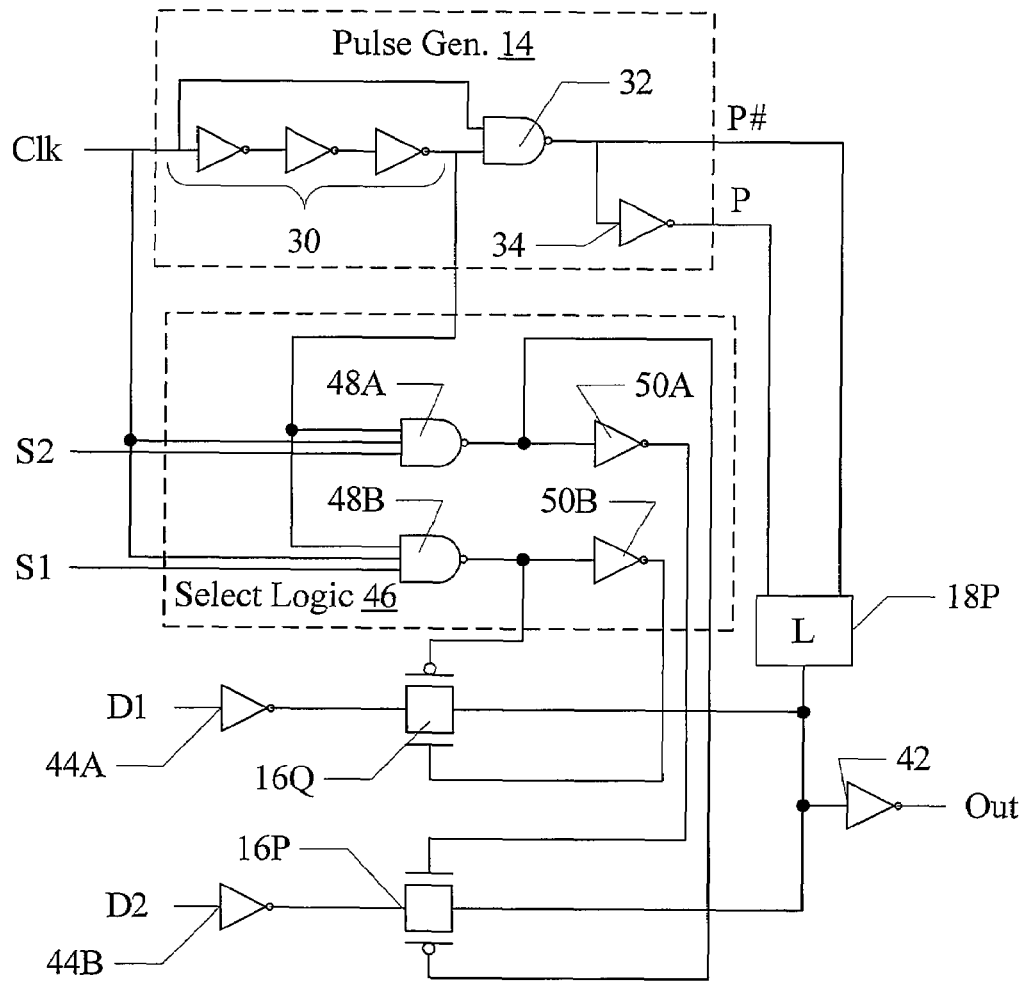
FIG. 3 is a circuit diagram of one embodiment of a combined mux/pulsed flop.

FIG. 3 is a circuit diagram of one embodiment of combined mux/pulsed flop 40. The combined mux/pulsed flop 40 combines the function of a multiplexor (mux) and a pulsed flop. The embodiment in FIG. 3 has two mux inputs (D1 and D2) and corresponding select signals (S1 and S2). However, other embodiments may have any number of two or more mux inputs and corresponding select signals. The embodiment of FIG. 3 includes the pulse generator 14 shown in FIG. 2 providing P and P# control signals to a latch element 18P. The latch element 18P is connected outside the path from the output of the passgates to the output inverter 42, reducing flop overhead similar to the embodiment of FIG. 1. While an inverter 42 is used in this embodiment, an output logic circuit 20 could be used in other embodiments, similar to FIG. 1, with multiple mux/flop outputs provided as inputs. The data inputs D1 and D2 are coupled to respective input inverters 44A-44B in this embodiment, the outputs of which are coupled to respective passgates 16Q and 16P. In other embodiments, one or more mux inputs may be calculated by embedded logic circuit inputs, similar to FIG. 1. The outputs of the passgates 16Q and 16P are directly connected to the input of the output inverter 42. While specific logic is shown in the embodiment of FIG. 3, other embodiments may use other logic circuitry, including Boolean equivalents of that shown in FIG. 3.

The mux/flop 40 also includes a select logic circuit 46 that generates the control signals for the passgates 16Q and 16P. The control signals to the passgates 16Q and 16P may be similar to the P and P# control signals, but may also be gated by the select signals S1 and S2 such that only the passgate 16Q or 16P that receives the selected data input D1 or D2 is opened for a given clock cycle.

In the illustrated embodiment, the select logic circuit 46 receives the output of the series-connected inverters 30 and the clock signal Clk, along with the select signals S1 and S2. Effectively, the select logic 46 replicates the NAND gate 32 and the inverter 34 of the pulse generator 14 for each passgate 16Q and 16P, except that the NAND gate also has an input for the corresponding select signal. Thus, the select logic circuit 46 includes a NAND gate 48A corresponding to the D2 input and a NAND gate 48B corresponding to the D1 input. The NAND gates 48A-48B each have inputs coupled to receive the clock signal Clk and the delayed clock signal output from the series-connected inverters 30. Additionally, the NAND gate 48A is coupled to receive the S2 select signal as an input and the NAND gate 48B is coupled to receive the S1 signal as an output. Inverters 50A-50B are coupled to the outputs of the NAND gates 48A-48B. The outputs of the NAND gate 48A and the inverter 50A are the control signals for the passgate 16P, and the outputs of the NAND gate 48B and the inverter 50B are the control signals for the passgate 16Q, as illustrated in FIG. 3.

For a given clock cycle, only one of the select inputs S1 and S2 is asserted, and thus only one of the passgates 16Q or 16P is opened for that clock cycle. The latch element 18P captures the selected data, and the selected data is driven out through the inverter 42 in parallel. It is noted that, while the select signals are provided in a one-hot fashion and have a one-to-one correspondence to data input signals, other embodiments may encode the select signals. In such embodiments, the select logic circuit 46 may further include a decoder to decode the encoded select signals into a one-hot format. It is further noted that other embodiments may include an enable for clock gating, and the enable may be an input to each of the NAND gates 32 and 48A-48B.

Figure 4:
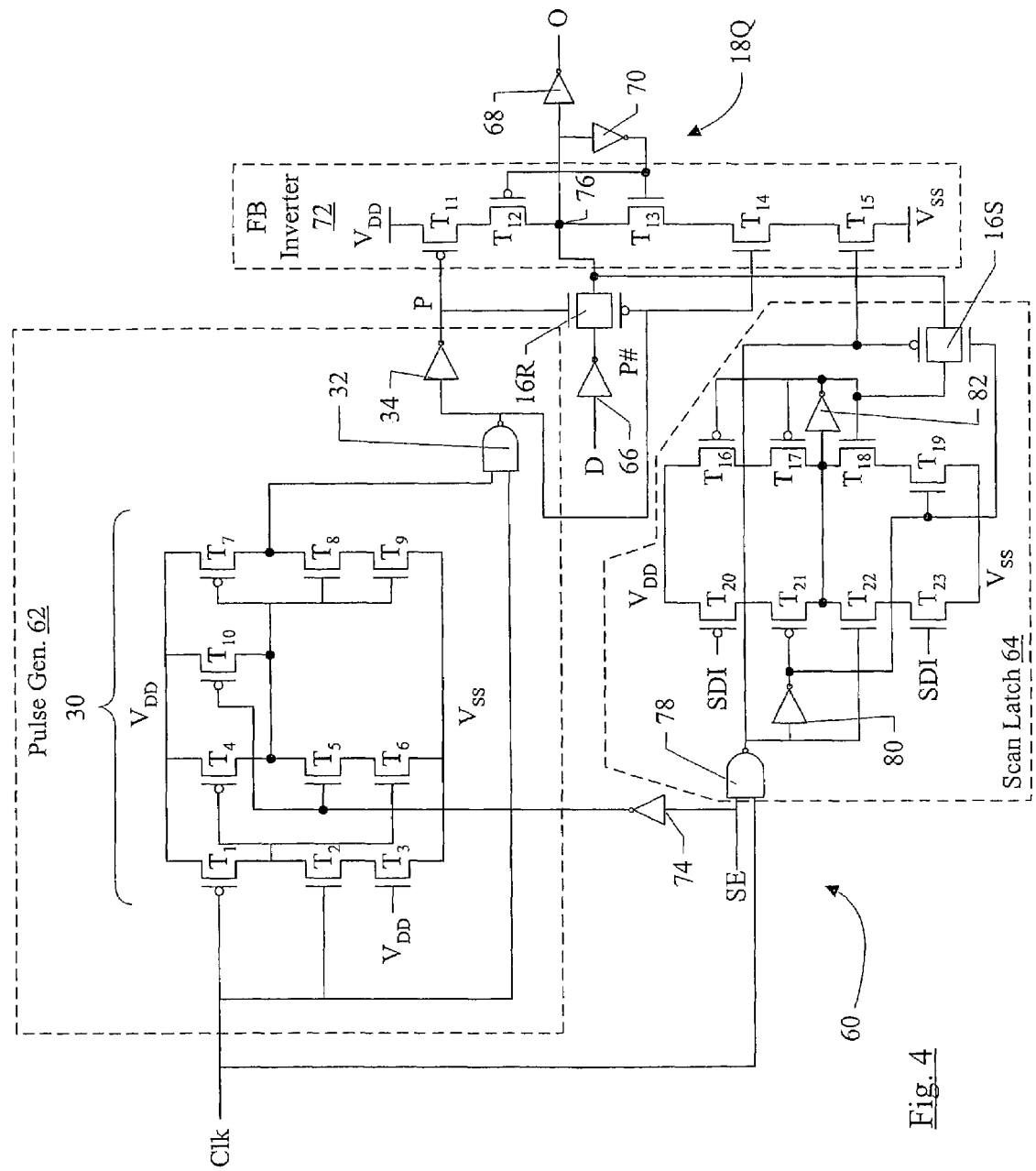
FIG. 4 is a circuit diagram of one embodiment of a pulsed flop with scan circuitry.

Turning now to FIG. 4, a circuit diagram of one embodiment of a pulsed flop 60 with scan circuitry is shown. In the illustrated embodiment, the pulsed flop 60 includes a pulse generator 62, a scan latch 64, an input inverter 66, an output inverter 68, a latch element 18Q, and a passgate 16R. The input inverter 66 is coupled to receive the input to the flop 60 (D) and is connected directly to the input of the passgate 16R. The passgate 16R is coupled to receive P and P# control signals from the pulse generator 62 and has an output connected directly to the storage node of the latch element 18Q and the input of the inverter 68. The latch element 18Q includes cross-coupled inverters 70 and 72, where inverter 72 is also coupled to receive the P and P# control signals and a control signal from the scan latch 64. The storage node is indicated by reference numeral 76. The scan latch 64 and the pulse generator 62 are coupled to receive the clock signal Clk. The scan latch 64 is coupled to receive the scan enable signal SE, and the pulse generator 62 is coupled to receive an inverted version of the scan enable signal SE through inverter 74. A passgate 16S in the scan latch 64 is connected directly to the storage node 76 as well. While specific logic is shown in the embodiment of FIG. 4, other embodiments may use other logic circuitry, including Boolean equivalents of that shown in FIG. 4.

The scan circuit 64 is provided to receive scan in data (SDI) during scan operation, and to provide the scan in data on the storage node 76 while presenting a relatively small load on the storage node 76 (and thus limiting the effect of the scan functionality on functional path of the flop 60). Particularly, during normal operation (scan enable deasserted), the passgate 16S in the scan latch 64 is closed and thus the effect on the storage node 76 is approximately limited to the capacitive load of the passgate 16S.

During scan operation, the pulse generator 62 is also disabled so that data on the D input to the flop 60 is not written into the latch element 18Q, potentially overwriting scan data. In the illustrated embodiment, the pulse generator 62 receives an inversion of the scan enable signal SE. In other embodiments, the pulse generator 62 may receive the scan enable signal SE directly, or a buffered version of the scan enable signal SE. Thus, in general, the pulse generator 62 may receive a signal derived from the scan enable signal, where the signal derived from the scan enable signal may be the signal itself, a buffered version of the signal, or an inverted (and possibly additionally buffered) version of the signal. Accordingly, the scan enable signal controls which of the passgates 16R and 16S is pulsed during a given clock cycle of the clock signal Clk, and thus controls which of the passgates 16R and 16S writes data onto the storage node 76 for the given clock cycle. If the scan enable signal is asserted, the passgate 16S is pulsed and the scan data is written to the storage node. If the scan enable signal is deasserted, the passgate 16R is pulsed and the data is written to the storage node 76.

The pulse generator 62 includes the series-connected inverters 30, the NAND gate 32, and the inverter 34, similar to the embodiment of FIG. 2. However, the series-connected inverters are designed somewhat differently in this embodiment to permit gating of the clock when the scan enable signal in asserted. Particularly, each inverter includes three transistors in the illustrated embodiment: transistors $T_1$, $T_2$, and $T_3$ for the initial inverter; transistors $T_4$, $T_5$, and $T_6$ for the middle inverter; and transistors $T_7$, $T_8$, and $T_9$ for the last inverter. Additionally, a transistor $T_{10}$ is shown. Each transistor $T_1$-$T_{10}$ is either PMOS or NMOS, as illustrated in FIG. 4 and coupled as shown in FIG. 4.

The transistors $T_4$ and $T_6$ in the middle inverter have gates that are coupled to receive the output of the initial inverter. Thus, the transistors $T_4$ and $T_6$ provide the inversion function. The transistor $T_5$ has its gate coupled to receive the inverted scan enable signal from the inverter 74, and is coupled between the transistor $T_6$ and the output node of the middle inverter. Accordingly, the transistor $T_5$ may isolate the transistor $T_6$ from the output node of the inverter if the scan enable signal is asserted (and thus the inverted scan enable signal is deasserted), preventing the transistor $T_6$ from affecting the output node of the middle inverter. The transistor $T_{10}$ is coupled to the output node of the middle inverter and to the power supply voltage $V_{DD}$, and also has its gate coupled to receive the inverted scan enable signal. If the scan enable signal is asserted, the transistor $T_{10}$ pulls up the output of the middle inverter (e.g. to the $V_{DD}$ voltage). The pull up action of the transistor $T_{10}$ causes the output of the last inverter to be a logical zero, which ensures that the P and P# signals are held in their deasserted states will scan is active.

It is noted that, while the embodiment of FIG. 4 disables the middle inverter of the series-connected inverters 30, other embodiments may disable other inverters. For example, the last inverter could be disable by inserting an additional PMOS transistor between transistor $T_7$ and the output node of the last inverter, and connecting a pull down NMOS transistor to the output node of the last inverter. These two transistors would be coupled to receive the scan enable signal (not inverted) or a buffered version of the scan enable signal. The initial inverter could be disabled in a similar fashion.

The last inverter and the first inverter in the series-connected inverters 30 of the illustrated embodiment also include three transistors. In this fashion, symmetry may be provided among the inverters in the series (e.g. each may have similar rise and fall time characteristics). Other embodiments need not provide such symmetry, if desired. All of the transistors $T_7$-$T_9$ in the last inverter have their gates coupled to the output node of the preceding inverter, and thus the three transistors operate as a normal inverter from a logical standpoint. The transistors $T_1$ and $T_2$ have gates coupled to receive the clock signal Clk. The transistor $T_3$ could also have its gate coupled to the clock signal Clk. However, clock signals are often more heavily loaded than other signals. Accordingly, to avoid additional load on the clock signal, the transistor $T_3$ has its gate coupled to $V_{DD}$. Thus, the transistor $T_3$ is effectively on at all times. The transistors $T_1$-$T_3$ thus function as a normal inverter from a logical standpoint.

The feedback inverter 72 comprises transistors $T_{11}$, $T_{12}$, $T_{13}$, $T_{14}$, and $T_{15}$ in this embodiment (PMOS and NMOS, as shown in FIG. 4 and coupled as shown in FIG. 4). The transistors $T_{12}$ and $T_{13}$ have their gates coupled to the output of the inverter 70, and thus provide the inversion operation in the feedback inverter 72. Transistors $T_{11}$ and $T_{14}$ have their gates coupled to receive the P and P# control signals, respectively. Thus, when pulses are asserted on the P and P# control signals, the transistors $T_{11}$ and $T_{14}$ are off and prevent the feedback inverter 72 from driving the storage node 76, thus permitting the data input to be driving onto the storage node 76 and capture by the latch element 18Q. As mentioned above with regard to FIG. 1, the transistors $T_{11}$ and $T_{14}$ may aid the robustness of the flop 60 when the supply voltage ($V_{DD}$) magnitude is relatively low, and may also improve the speed of the circuit in some embodiments. Furthermore, during times that the scan enable signal is asserted (and thus the control signals P and P# are held in their deasserted states), the transistors $T_{11}$ and $T_{14}$ are on and the feedback inverter 72 is cooperating in retaining the data stored in the latch element 18Q.

When scan data is to be written into the latch element 18Q, the transistors $T_{11}$ and $T_{14}$ are on. Accordingly, the transistor $T_{15}$ is included to disable the pull down portion of the feedback inverter 72 when the passgate 16S is open. In some embodiments, a corresponding PMOS transistor may be included above the transistor $T_{11}$ and coupled to the inverse of the gate of transistor $T_{15}$ as well. However, in scan mode, the supply voltage ($V_{DD}$) magnitude may be set to a nominal value, and the contention of the feedback inverter 72 and the scan latch 64 may be resolved by appropriate device sizing. Accordingly, a PMOS transistor may not be needed in such embodiments.

The control signals on the passgate 16S may be generated from the scan enable signal SE and the clock signal Clk. Particularly, in the embodiment of FIG. 4, a NAND gate 78 has these signals as inputs. If the scan enable signal is deasserted, the output of the NAND gate 78 is a logical one independent of the state of the clock signal Clk. If the scan enable signal is asserted, the inverse of the clock signal Clk is passed through the NAND gate 78. The output of the NAND gate 78 is coupled to the gate of the transistor $T_{15}$, and thus if the scan enable is deasserted, the transistor $T_{15}$ is on. Additionally, the transistor $T_{15}$ is off if the scan enable is asserted and the clock signal is high, permitting the scan data to pass through the passgate 16S and be captured on the storage node 76. The output of the NAND gate 78 also supplies the control signal to the PMOS transistor in the passgate 16S. The NMOS transistor in the passgate 16S is controlled by the inverted output of the NAND gate 78 through the inverter 80.

The transistors $T_{16}$, $T_{17}$, $T_{18}$, and $T_{19}$ form an inverter which, in combination with the inverter 82, form a latch element to store the scan data in the scan latch 64. The gates of the transistors $T_{16}$, $T_{17}$, and $T_{18}$ are coupled to the output of the inverter 82, and thus provide the inversion function. The gate of the transistor $T_{19}$ is coupled to the output of the inverter 80, and thus prevents the pull down function of the inverter when scan data is being supplied to the latch element. As with the inverter 72, the inverter formed from transistors $T_{16}$-$T_{19}$ may not include a PMOS transistor to prevent the pullup function, since scan may be performed with a nominal $V_{DD}$ voltage. Other embodiments may include a PMOS transistor coupled to the output of the NAND gate 78, if desired.

The latch element in the scan latch 64 is driven by an inverter formed from the transistors $T_{20}$, $T_{21}$, $T_{22}$, and $T_{23}$. The transistors $T_{20}$ and $T_{23}$ have their gates coupled to receive the scan data in, and thus provide the inversion function. The transistors $T_{21}$, and $T_{22}$ have their gates coupled to the output of the inverter 80 and the NAND gate 78, respectively. The transistor $T_{21}$, and $T_{22}$ disable the inverter if scan is enabled and the clock signal Clk is high, permitting scan data to write the storage node only when the clock signal Clk is low. Thus, the input inverter writes the scan data to the storage node (the input of the inverter 82) when the clock signal Clk is low (which is also when the transistor $T_{19}$ is off). The input inverter is disabled and the latch element in the scan latch 64 retains data when the scan enable is asserted and the clock signal is high (which is also when the scan data is supplied to the storage node 76).

It is noted that, in other embodiments, the inverter 66 may be replaced by an input logic circuit similar to the logic circuits 12A-12N. Similarly, in some embodiments, the inverter 68 may be replaced by an output logic circuit 20 (and other latch elements and corresponding scan latches may be included).

It is noted that, in some embodiments, the flop 60 may include a scan data out output separate from the data output. For example, the storage node 76 may be coupled as an input to a NAND gate that has another input coupled to the scan enable signal SE. When the scan enable signal is asserted, the scan data from the storage node 76 may be supplied (inverted) on the scan data out output signal.

Numerous variations and modifications will become apparent to those skilled in the art once the above disclosure is fully appreciated. It is intended that the following claims be interpreted to embrace all such variations and modifications.

What is claimed is:

1. A storage circuit comprising:
a first passgate having an input coupled to receive a signal representing a data input to the storage circuit and further having an output connected to a storage node in the storage circuit; and
a scan latch having an input connected to a scan data input to the storage circuit and further coupled to receive a scan enable input, wherein the scan latch is configured to store the scan data input responsive to an assertion of the scan enable input, and wherein the scan latch comprises a second passgate connected to the storage node and having an input coupled to receive the stored scan data;
wherein each of the first passgate and the second passgate are coupled to receive respective pairs of control signals to control opening and closing of the passgates, and wherein the scan enable signal controls which of the respective pairs of control signals are pulsed, whereby only one of the first passgate and the second passgate is opened in a given clock cycle of a clock signal from which the pulses are generated.

2. The storage circuit as recited in claim 1 wherein the second passgate is opened if the scan enable signal is asserted.

3. The storage circuit as recited in claim 2 wherein the first passgate is opened if the scan enable signal is deasserted.

4. The storage circuit as recited in claim 3 further comprising a pulse generator configured to generate pulses on the pair of control signals to the first passgate, wherein the pulse generator comprises first and second transistors having gates controlled according to the scan enable signal.

5. The storage circuit as recited in claim 4 wherein the first transistor is included in an inverter within the pulse generator, wherein the first transistor is coupled between an output node of the inverter and a third transistor controlled by the clock signal input to the pulse generator.

6. The storage circuit as recited in claim 5 wherein the second transistor is coupled to the output node of the inverter and is configured to drive the output node of the inverter if the scan enable signal is asserted.

7. The storage circuit as recited in claim 6 wherein the second transistor is configured to pull up the output node of the inverter if the scan enable signal is asserted.

8. The storage circuit as recited in claim 4 wherein the scan latch is coupled to receive the same clock signal as the pulse generator, wherein the scan latch is configured to generate control signals for the second passgate responsive to the clock signal and the scan enable signal.

9. The storage circuit as recited in claim 1 further comprising cross coupled inverters coupled between the storage node and another node, and wherein a first inverter of the cross coupled inverters is configured to drive the storage node, and wherein the first inverter is coupled to receive the pair of control signals for the first passgate and is configured to inhibit driving the storage node responsive to pulses on the pair of control signals.

10. The storage circuit as recited in claim 9 wherein the first inverter is further coupled to receive at least one of the control signals to the second passgate, and wherein the first inverter is further configured to inhibit driving the storage node responsive to a pulse on the at least one of the control signals to the second passgate.

11. A pulse generator for a scannable storage circuit, the pulse generator configured to generate a pair of control pulses that cause the scannable storage circuit to store a data input to the storage circuit, the pulse generator comprising:
a plurality of series-connected inverters, wherein a first inverter of the plurality of series-connected inverters comprises a first transistor coupled between an output node of the first inverter and a second transistor of the first inverter, and wherein a gate of the first transistor is coupled to receive a signal derived from a scan enable signal, and wherein a gate of the second transistor is coupled to an output of a second inverter of the plurality of series-connected inverters, and wherein the first transistor, during use, isolates the output node of the first inverter from the second transistor responsive to an assertion of the scan enable signal, and wherein the second inverter comprises a third transistor coupled between an output node of the second inverter and a fourth transistor, and wherein a gate of the fourth transistor is connected directly to the power supply voltage.

12. The pulse generator as recited in claim 11 further comprising a fifth transistor coupled to the output node of the first inverter and having a gate coupled to receive the signal derived from the scan enable signal.

13. The pulse generator as recited in claim 12 wherein the fifth transistor is configured to pull up the output node of the first inverter responsive to the assertion of the scan enable signal.

14. The pulse generator as recited in claim 11 wherein an output of the plurality of series-connected inverters is coupled to an input of a NAND gate, and wherein another input of the NAND gate is coupled to an input of the plurality of series-connected inverters.

15. The pulse generator as recited in claim 14 wherein the input of the plurality of series-connected inverters is a clock signal.

16. The pulse generator as recited in claim 14 wherein an output of the NAND gate is one of the pair of control pulses.

17. The pulse generator as recited in claim 16 wherein the output of the NAND gate is coupled to an input of an inverter, and wherein an output of the inverter is another one of the pair of control pulses.

18. The pulse generator as recited in claim 11 wherein a third inverter of the plurality of series-connected inverters comprises a fifth transistor and a sixth transistor, wherein the fifth transistor is coupled between an output node of the third inverter and the sixth transistor, and wherein the gates of both the fifth transistor and the sixth transistor are coupled to the output of the first inverter.

* * * * *